(12) United States Patent
Nomura

(10) Patent No.: US 6,351,833 B1
(45) Date of Patent: Feb. 26, 2002

(54) ADDRESS GENERATOR

(75) Inventor: Hiroshi Nomura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/248,915

(22) Filed: Feb. 10, 1999

(30) Foreign Application Priority Data

Feb. 18, 1998 (JP) .......................................... 10-035613

(51) Int. Cl.[7] .......................... G11C 29/00; G11C 8/00; G06F 12/00
(52) U.S. Cl. ............................ 714/718; 711/1; 365/236
(58) Field of Search .......................... 714/718; 711/200, 711/217, 218, 219, 220, 1, 2, 6; 365/230.01, 230.06, 236

(56) References Cited

U.S. PATENT DOCUMENTS

| | | | | |
|---|---|---|---|---|
| 4,787,065 A | * | 11/1988 | Barazesh et al. | ............ 711/219 |
| 5,905,665 A | * | 5/1999 | Rim | ............................ 708/491 |
| 6,104,664 A | * | 8/2000 | Ohno | ..................... 365/230.06 |
| 6,167,481 A | * | 12/2000 | Ban | .............................. 711/1 |

* cited by examiner

Primary Examiner—Christine T. Tu
(74) Attorney, Agent, or Firm—Merchant & Gould P.C.

(57) ABSTRACT

An address generator is provided for generating addresses needed to read out data from a memory. The address generator includes a first and a second latch circuits, and a first counter connected to each of the first and the second latch circuits. The address generator also includes a first and a second storages each of which is connected to the first counter. The address generator further includes a second counter connected to each of the first and the second storages.

8 Claims, 3 Drawing Sheets

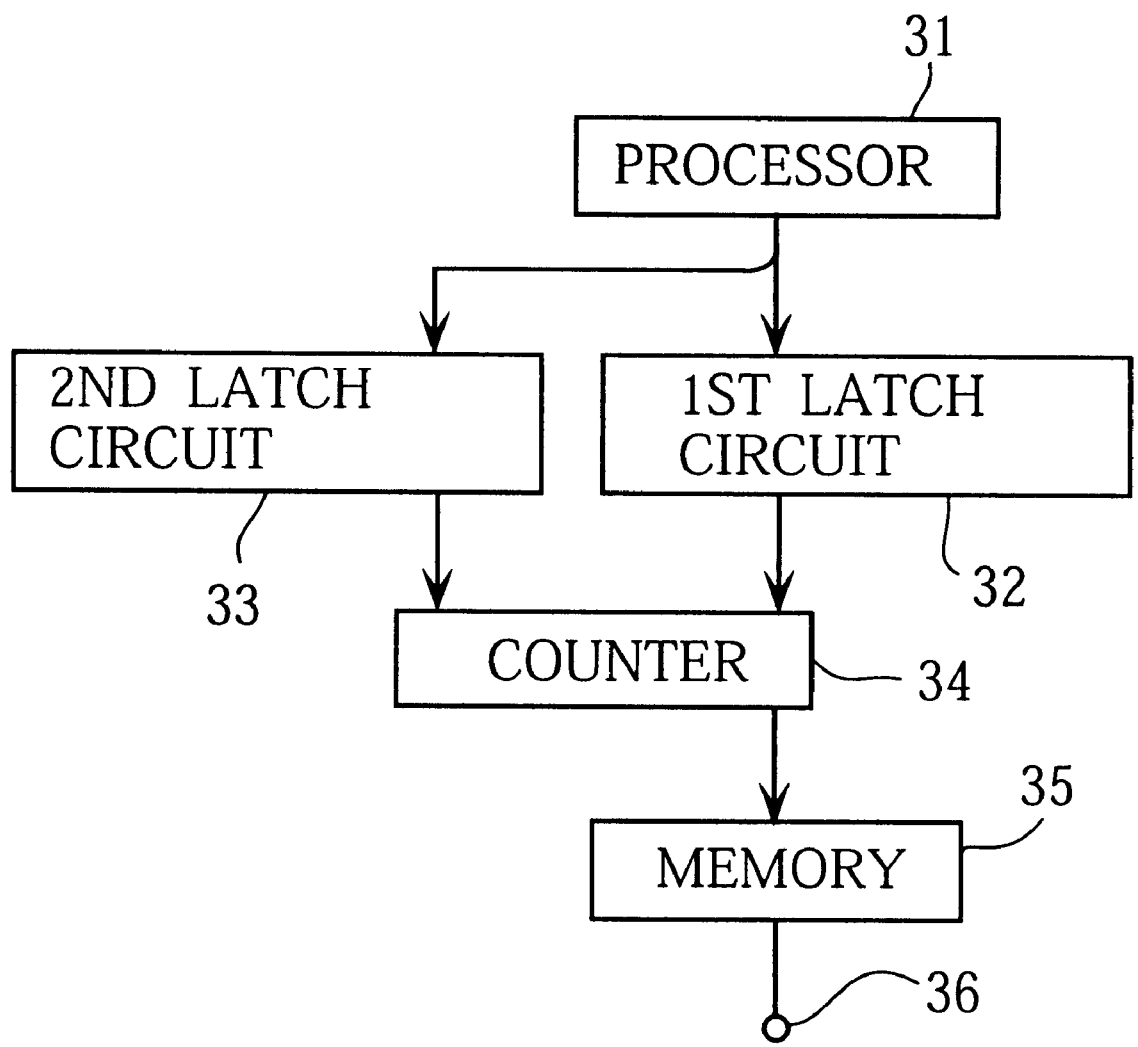

ADDRESS GENERATOR

BACKGROUND OF THE INVENTION

1. Field of the Invention

The present invention relates to an address generator used for generating addresses required to read out data from a memory. The present invention also relates to a semiconductor device tester incorporating such an address generator.

2. Description of the Related Art

Conventionally, use has been made of various types of testers for testing semiconductor devices such as LSIs (large-scale integrated circuits). In such a tester, a plurality of bit patterns may need to be generated for subjecting a semiconductor device to different kinds of tests.

For generating plural bit patterns, the conventional tester may be provided with a memory arranged to store a plurality of data (bit pattern units). Each of these data has the same bit number and is associated with a particular address in the memory. The conventional tester may also be provided with an address generator controlled by a suitable processor.

In operation, the address generator provides consecutive readout addresses under the control of the processor. These readout addresses are supplied to the memory of the tester. As a result, some of the bit pattern units whose addresses in the memory coincide with the readout addresses are output from the memory. Then, the output bit pattern units are combined to make a bit pattern required for performing a test of the semiconductor device.

The conventional address generator may have an arrangement shown in FIG. 4 of the accompanying drawings. Specifically, the address generator includes a first latch circuit 32, a second latch circuit 33 and a counter 34. The first and the second latch circuits 32–33 are associated with a processor 31 (which may be a microcomputer for example), while the counter 34 is associated with a memory 35.

The processor 31 sets a start address at the first latch circuit 32 while also setting a stop address at the second latch circuit 33. Then, based on these start and stop addresses, the counter 34 will perform counting at regular intervals.

In the above counting operation, the counter 34 first provides an initial count number which is equal to the start address, and then provides the next count number which is greater than the initial count number by one. Then, the counter 34 provides another count number which is greater than the above-mentioned next count number by one.

Such a procedure is continued until a count number provided by the counter 34 becomes equal to the stop address (maximum count number). Each of the above count numbers (namely, the initial count number, the intermediate count numbers and the maximum count number) is subsequently supplied to the memory 35 as a readout address. As a result, the memory 35 repeatedly outputs a piece of data whose address in the memory coincides with a readout address supplied from the counter 34. The thus output data are supplied to a terminal 36.

The conventional address generator has been found disadvantageous in the following points.

With the use of the conventional address generator, the processor 31 needs to reset the start address and the stop address after the counter 34 has finished supplying the first series of readout addresses to the memory 35. In such an arrangement, the software for operating the processor 31 tends to be unfavorably complicated. In addition, the load on the processor 31 becomes unduly great.

Further, when a low-performance microcomputer is used for the processor 31, the conventional address generator suffers from the following problem. Supposing that the counter 34 is operated at high speed (based on a clock signal having a frequency of 1–20 MHz for example), the processor 31 may fail to renew the start and the stop addresses at the first and the second latch circuits 32–33 since the processing speed of the low-performance processor 31 is not high enough. As a result, the counter 34 will repeatedly generate the same series of readout addresses based on the unaltered start address and stop address.

Even in an instance where the start address and the stop address cannot be renewed, a desired bit pattern may be obtainable from the memory 35. Specifically, by causing the desired bit pattern as a whole to be stored in the memory 35, that particular bit pattern can be read out from the memory 35 based on the unaltered start and stop addresses. However, such an arrangement may need an unfavorably great number of addresses in the memory 35 since the entirety of the bit pattern has to be stored in the memory 35. In other words, the above arrangement requires the memory 35 to have an extremely large storage capacity, which is disadvantageous in terms of costs for example.

SUMMARY OF THE INVENTION

It is, therefore, an object of the present invention is to provide an address generator which eliminates or reduces the above-described problems.

Another object of the present invention is to provide a semiconductor device tester incorporating such an address generator.

According to a first aspect of the present invention, there is provided an address generator for generating addresses needed to read out data from a memory, the address generator comprising:

a first and a second latch circuits;

a first counter connected to each of the first and the second latch circuits;

a first and a second storages each connected to the first counter; and a second counter connected to each of the first and the second storages.

With such an arrangement, it is possible to reduce the load on a processor used for controlling the address generator. In addition, programs for operating the processor are advantageously simplified.

According to a preferred embodiment, the first latch circuit is arranged to latch a first start address, while the second latch circuit is arranged to latch a first stop address.

The first counter may perform counting based on the first start address and the first stop address.

The first counter may supply a count number to each of the first and the second storages, the count number supplied by the first counter being obtained from the counting by the first counter.

The first storage may store a plurality of second start addresses, the first storage being arranged to supply one of the second start addresses to the second counter in response to the count number from the first counter.

Likewise, the second storage may store a plurality of second stop addresses, the second storage being arranged to supply one of the second stop addresses to the second counter in response to the count number from the first counter.

Preferably, the second counter may perform counting based on said one of the second start addresses and said one of the second stop addresses.

The second counter may supply a count number to the memory, the count number supplied by the second counter being obtained from the counting by the second counter.

According to a second aspect of the present invention, there is provided a semiconductor device tester comprising:

a processor for controlling the semiconductor device tester;

an address generator provided with a first latch circuit, a second latch circuit, a first counter, a first storage, a second storage and a second counter;

a memory connected to the second counter; and a wave form processing circuit connected to the memory.

According to a preferred embodiment, the processor comprises a microcomputer.

The memory may comprise a random access memory.

According to the preferred embodiment, the processor supplies a first start address to the first latch circuit while also supplying a first stop address to the second latch circuit.

Advantageously, each of the first and the second latch circuits may be connected to the first counter, the first counter being connected to each of the first and the second storages, each of the first and the second storages being connected to the second counter.

Other objects, features and advantages of the present invention will become clearer from the detailed description of preferred embodiments given below with reference to the accompanying drawings.

BRIEF DESCRIPTION OF THE DRAWINGS

In the accompanying drawings:

FIG. 4 is a block diagram showing principal circuits of a conventional address generator.

DETAILED DESCRIPTION OF THE PREFERRED EMBODIMENTS

The preferred embodiment of the present invention will be described below with reference to FIGS. 1–3 of the accompanying drawings.

Figure 1:
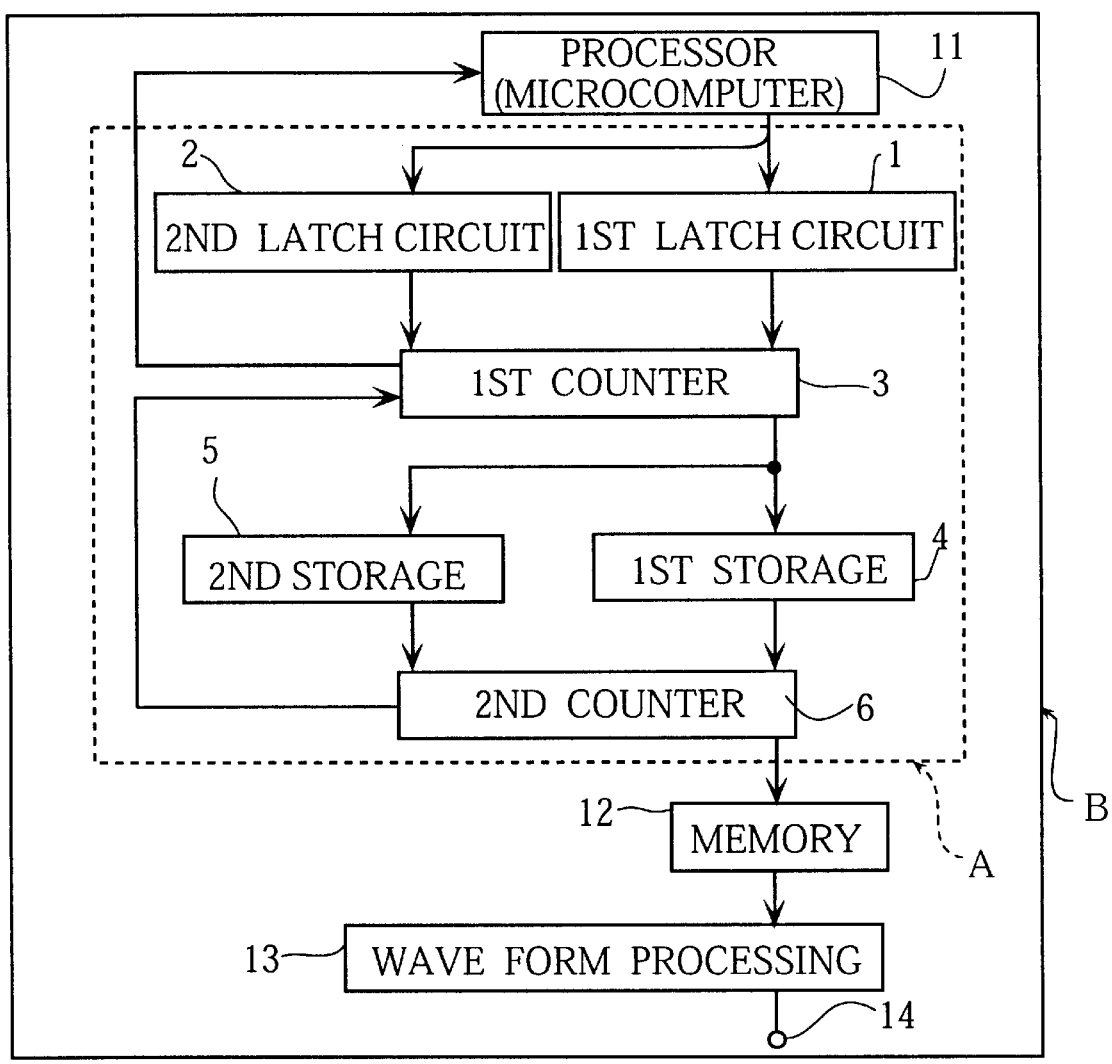
FIG. 1 is a block diagram showing principal circuits of an address generator according to the present invention.

FIG. 1 is a block diagram showing principal circuits of an address generator A according to the present invention. As is shown, the address generator A includes a first latch circuit 1, a second latch circuit 2, a first counter 3, a first storage 4, a second storage 5, and a second counter 6.

The first latch circuit 1 and the second latch circuit 2 are connected to the first counter 3 which is in turn connected to the first and second storages 4–5. Each of the first and second storages 4–5 is connected to the second counter 6.

In the illustrated embodiment, the address generator A is incorporated in an LSI tester B. As is shown, besides the address generator A, the LSI tester B includes a processor 11 for performing overall control of the LSI tester. The processor 11 may be a microcomputer. The LSI tester B is also provided with a memory 12 and a wave form processing circuit 13. The memory 12 may be a RAM (random access memory) for example and stores plural pieces of data (see FIG. 3).

The first latch circuit 1 holds (latches) a first start address which is supplied from the processor 11 while also outputting the first start address to the first counter 3. Similarly, the second latch circuit 2 holds (latches) a first stop address which is supplied from the processor 11 while also outputting the first stop address to the first counter 3.

The first counter 3 performs a counting operation based on the first start address from the first latch circuit 1 and on the first stop address from the second latch circuit 2. Specifically, starting from the first start address (which may be referred to as "initial count number" below), the first counter 3 counts up by one every time a carry signal is supplied from the second counter 6.

More specifically, the first counter 3 first provides the initial count number (or the first start address). Then, when a carry signal is supplied to the first counter 3 from the second counter 6, the first counter 3 provides the next count number which is greater than the initial count number by one. Upon receiving another carry signal from the second counter 6, the first counter 3 provides another count number which is greater than the above-mentioned next count number by one.

Thereafter, the first counter 3 repeatedly performs the above operation until a count number provided by the counter 3 becomes equal to the first stop address from the second latch circuit 2. The first stop address may be referred to as "maximum count number" hereinafter.

Each of the count numbers provided by the first counter 3 is supplied to the first and second storages 4–5 as a readout address. When the count number at the first counter 3 becomes equal to the maximum count number (or the first stop address), the first counter 3 supplies a carry signal to the processor 11.

Figure 2:
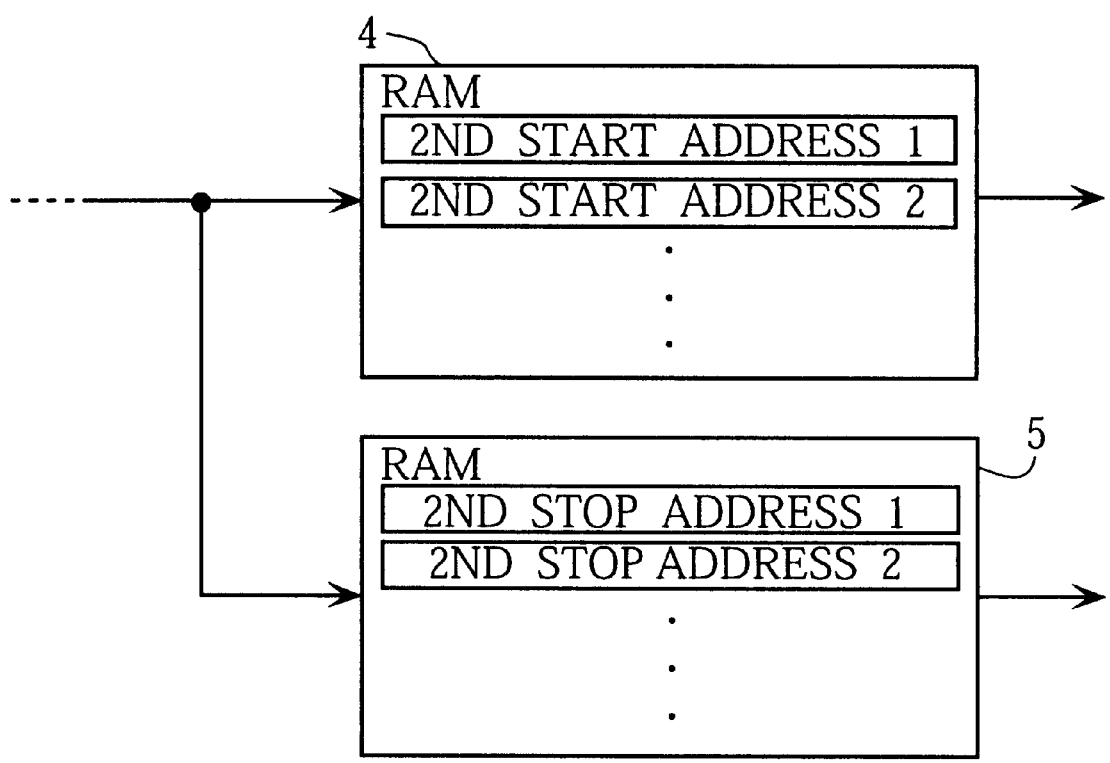
FIG. 2 is an enlarged view illustrating the first and second storages of the address generator shown in FIG. 1.
Figure 3:
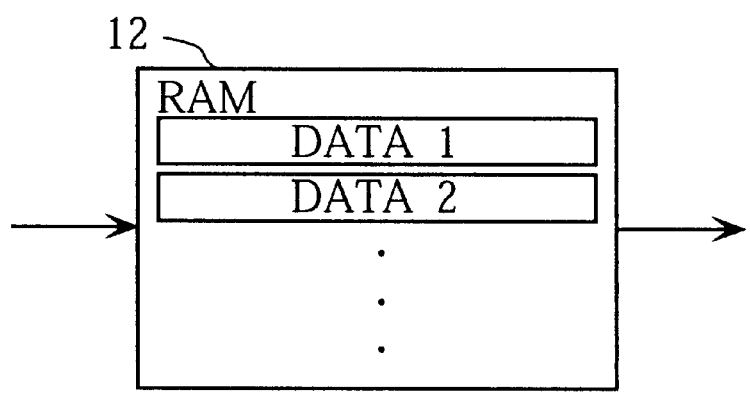
FIG. 3 is enlarged view illustrating the memory of a semiconductor device tester incorporating the address generator of FIG. 1.

The first storage 4 (which may be a RAM for example) stores a plurality of second start addresses, as shown in FIG. 2. Each of the second start addresses is associated with a certain address in the first storage 4. Thus, when the first counter 3 provides a certain count number, the first storage 4 outputs one of the second start addresses whose address in the storage 4 is equal to that particular count number supplied from the first counter 3. The selected second start address is supplied to the second counter 6.

The second storage 5 (which may also be a RAM for example) stores a plurality of second stop addresses, as shown in FIG. 2. Each of the second stop addresses is associated with a certain address in the second storage 5. Thus, when a count number is supplied from the first counter 3, the second storage 5 outputs one of the second stop addresses whose address in the storage 5 is equal to the supplied count number from the first counter 3. The selected second stop address is supplied to the second counter 6.

The second counter 6 performs a counting operation based on the second start address from the first storage 4 and on the second stop address from the second storage 5. Specifically, starting from the second start address (which may be referred to as "initial count number" below), the second counter 6 counts up by one every time a clock signal having a predetermined frequency is supplied.

Each of the count numbers provided by the second counter 6 is supplied to the memory 12 as a readout address. The second counter 6 supplies a carry signal to the first counter 3 when a count number at the second counter 6 becomes equal to the second stop address from the second storage 5 (which address may be referred to as "maximum count number" below).

When a readout address is supplied to the memory 12 from the second counter 6, data stored at an address coinciding with the readout address is output to the wave form processing circuit 13. Then, the wave form processing circuit 13 subjects the data to predetermined processing such as wave form adjustment. Thereafter, the processed data is output from a terminal 14.

Description will now be made to operations of the address generator of the present invention. First, the processor 11 supplies a first start address to the first latch circuit 1 while also supplying a first stop address to the second latch circuit 2. Then, the first latch circuit 1 holds the first start address while also supplying the first start address (which serves as an initial count number) to the first counter 3. Similarly, the second latch circuit 2 holds the first stop address while also supplying the first stop address (which serves as a maximum count number) to the first counter 3. At this stage, the first counter 3 supplies the initial count number (i.e., the first start address) to the first and the second storages 4–5 as a readout address.

Upon receiving the readout address, the first storage 4 supplies a piece of data to the second counter 6. Here, the supplied piece of data is the one which is stored in the first storage 4 and whose address coincides with the readout address from the first counter 3. The above data from the first storage 4 to the second counter 6 may be referred to as "a second start address" hereinafter.

When the readout address is supplied to the second storage 5 from the first counter 3, the second storage 5 supplies a piece of data to the second counter 6. Here, the supplied piece of data is the one which is stored in the second storage 5 and whose address coincides with the readout address from the first counter 3. The data supplied from the second storage 5 to the second counter 6 may be referred to as "a second stop address" hereinafter.

After receiving the second start address and the second stop address, the second counter 6 supplies the second start address (serving as an initial count number) to the memory 12 in synchronism with a rise of a clock signal.

Then, the memory 12 supplies a certain piece of data to the wave form processing circuit 13. Here, the supplied piece of data is the one which is stored in the memory 12 and whose address coincides with the second start address from the second counter 6.

In the wave form processing circuit 13, the data is subjected to predetermined processing such as wave form adjustment. Thereafter, the processed data is supplied to a non-illustrated circuit of the LSI tester via the terminal 14.

At the time of the next rise of the clock signal supplied to the second counter 6, the count number at the second counter 6 is increased by one and the incremented count number (or the incremented readout address) is supplied to the memory 12. As a result, a different piece of data will be output from the memory 12.

In the same manner thereafter, other pieces of data will subsequently be output from the memory 12 in synchronism with the corresponding rises of the clock signal. When the count number at the second counter 6 becomes equal to the second stop address (serving as a maximum count number) supplied from the second storage 5, the second counter 6 supplies a carry signal to the first counter 3.

When the above carry signal is supplied to the first counter 3, the count number at the first counter 3 is increased by one and the increased count number (or the increased readout address) is supplied to the first storage 4 and the second storage 5. As a result, the second start address from the first storage 4 and the second stop address from the second storage 5 will be renewed.

Thereafter, the second counter 6 will be operated in the same manner described above on the basis of the renewed second start address and the renewed second stop address. As a result, different pieces of data will subsequently be read out from the memory 12.

The second start address from the first storage 4 and the second stop address from the second storage 5 will be renewed a certain number of times. Thereafter, when the count number at the first counter 3 becomes equal to the maximum count number (i.e., the first stop address from the second latch circuit 2), the first counter 3 supplies a carry signal to the processor 11. As a result, the processor 11 supplies a renewed first start address to the first latch circuit 1 while also supplying a renewed first stop address to the second latch circuit 2.

Such operations will be repeated, so that required bit patterns for testing a semiconductor device are provided from the memory 12 via the wave form processing circuit 13 and the terminal 14.

According to the present invention, in order to generate readout addresses needed for causing the memory 12 to output desired data, use is made of two start addresses (first and second) and two stop addresses (first and second), wherein a set of the first start address and the first stop address and a set of the second start address and the second stop address are separately generated. Of the two sets of addresses, it is only the first start address and the first stop address that the processor 11 needs to set. Thus, the load to the processor 11 is advantageously reduced.

In the illustrated embodiment, the carry signal from the second counter 6 is supplied to the first counter 3. However, it is also possible to utilize no carry signals. In this instance, the first counter 3 and the second counter 6 may be operated in synchronism with two different clock signals, respectively, which have different frequencies. To realize such an operation, the data stored in the first and second storages 4–5 should be arranged so that the difference between the second start address and the second stop address is constant.

Further, in the illustrated embodiment, use is made of up-counters for the first counter 3 and the second counter 6. Alternatively, down-counters may also be usable. In this case, the first stop address which is held by the second latch circuit 2 and supplied to the first counter 3 serves as a minimum count number. Likewise, the second stop address which is stored in the second storage 5 and supplied to the second counter 6 serves as a minimum count number.

The present invention being thus described, it is obvious that the same may be varied in many other ways. Such variations should not be regarded as a departure from the spirit and scope of the present invention, and all such modifications as would be obvious to those skilled in the art are intended to be included within the scope of the following claims.

What is claimed is:

1. An address generator for generating addresses needed to read out data from a memory, the address generator comprising:

a first and a second latch circuits;

a first counter connected to each of the first and the second latch circuits;

a first and a second storages each connected to the first counter; and a second counter connected to each of the first and the second storages.

2. The address generator according to claim 1, wherein the first latch circuit is arranged to latch a first start address, the second latch circuit being arranged to latch a first stop address.

3. The address generator according to claim 1, wherein the first counter performs counting based on the first start address and the first stop address.

4. The address generator according to claim 3, wherein the first counter supplies a count number to each of the first and the second storages, the count number supplied by the first counter being obtained from the counting by the first counter.

5. The address generator according to claim 4, wherein the first storage stores a plurality of second start addresses, the first storage being arranged to supply one of the second start addresses to the second counter in response to the count number from the first counter.

6. The address generator according to claim 5, wherein the second storage stores a plurality of second stop addresses, the second storage being arranged to supply one of the second stop addresses to the second counter in response to the count number from the first counter.

7. The address generator according to claim 6, wherein the second counter performs counting based on said one of the second start addresses and said one of the second stop addresses.

8. The address generator according to claim 7, wherein the second counter supplies a count number to the memory, the count number supplied by the second counter being obtained from the counting by the second counter.

* * * * *